(12) United States Patent
Oonishi et al.

(10) Patent No.: US 11,569,771 B2
(45) Date of Patent: Jan. 31, 2023

(54) CONTROL APPARATUS AND SENSOR APPARATUS

(71) Applicant: KABUSHIKI KAISHA TOSHIBA, Tokyo (JP)

(72) Inventors: Atsuro Oonishi, Kawasaki Kanagawa (JP); Hiroshi Takahashi, Yokohama Kanagawa (JP); Takamitsu Sunaoshi, Yokohama Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 160 days.

(21) Appl. No.: 17/186,101

(22) Filed: Feb. 26, 2021

(65) Prior Publication Data

US 2022/0082530 A1 Mar. 17, 2022

(30) Foreign Application Priority Data

Sep. 15, 2020 (JP) .............................. JP2020-154731

(51) Int. Cl.
*H02P 25/032* (2016.01)
*G01N 29/14* (2006.01)
*H03K 19/20* (2006.01)
*H03K 3/037* (2006.01)

(52) U.S. Cl.
CPC ........... *H02P 25/032* (2016.02); *G01N 29/14* (2013.01); *H03K 3/037* (2013.01); *H03K 19/20* (2013.01)

(58) Field of Classification Search
CPC .............................. H02P 25/032; G01N 29/14
See application file for complete search history.

(56) References Cited

U.S. PATENT DOCUMENTS

| | | |
|---|---|---|
| 10,411,612 B2 | 9/2019 | Oonishi et al. |
| 10,615,726 B2 | 4/2020 | Oonishi et al. |
| 10,811,949 B2 | 10/2020 | Oonishi et al. |
| 2017/0059423 A1 | 3/2017 | Suzuki |
| 2019/0293601 A1 | 9/2019 | Sugiyama |
| 2019/0313181 A1 | 10/2019 | Fujimori et al. |
| 2019/0379227 A1* | 12/2019 | Oonishi .................... G05F 1/67 |
| 2021/0079900 A1* | 3/2021 | Oonishi .................. G01P 15/08 |

FOREIGN PATENT DOCUMENTS

| | | |
|---|---|---|
| JP | 6193322 B2 | 9/2017 |
| JP | 2017-229118 A | 12/2017 |
| JP | 2018-110315 A | 7/2018 |

(Continued)

*Primary Examiner* — Patrick O Neill
(74) *Attorney, Agent, or Firm* — Finnegan, Henderson, Farabow, Garrett & Dunner, LLP

(57) ABSTRACT

According to one embodiment, a control apparatus for controlling a sensor that operates on power supplied by a power generator via an electric circuit including a rectifying and smoothing circuit converting AC power output from the power generator into DC power and a converter transforming an output voltage of the rectifying and smoothing circuit includes a first and a second signal generator and a controller. The first signal generator generates a first signal based on the output voltage of the rectifying and smoothing circuit. The second signal generator generates a second signal based on an output voltage of the converter. The controller switches an operation mode of the sensor between a sleep mode and an active mode based on the first and second signals.

10 Claims, 4 Drawing Sheets

(56) References Cited

FOREIGN PATENT DOCUMENTS

| | | |
|---|---|---|
| JP | 2018-157724 A | 10/2018 |
| JP | 2019-022409 A | 2/2019 |
| JP | 2019-042710 A | 3/2019 |
| JP | 2019-162905 A | 9/2019 |
| JP | 2019-168331 A | 10/2019 |

* cited by examiner

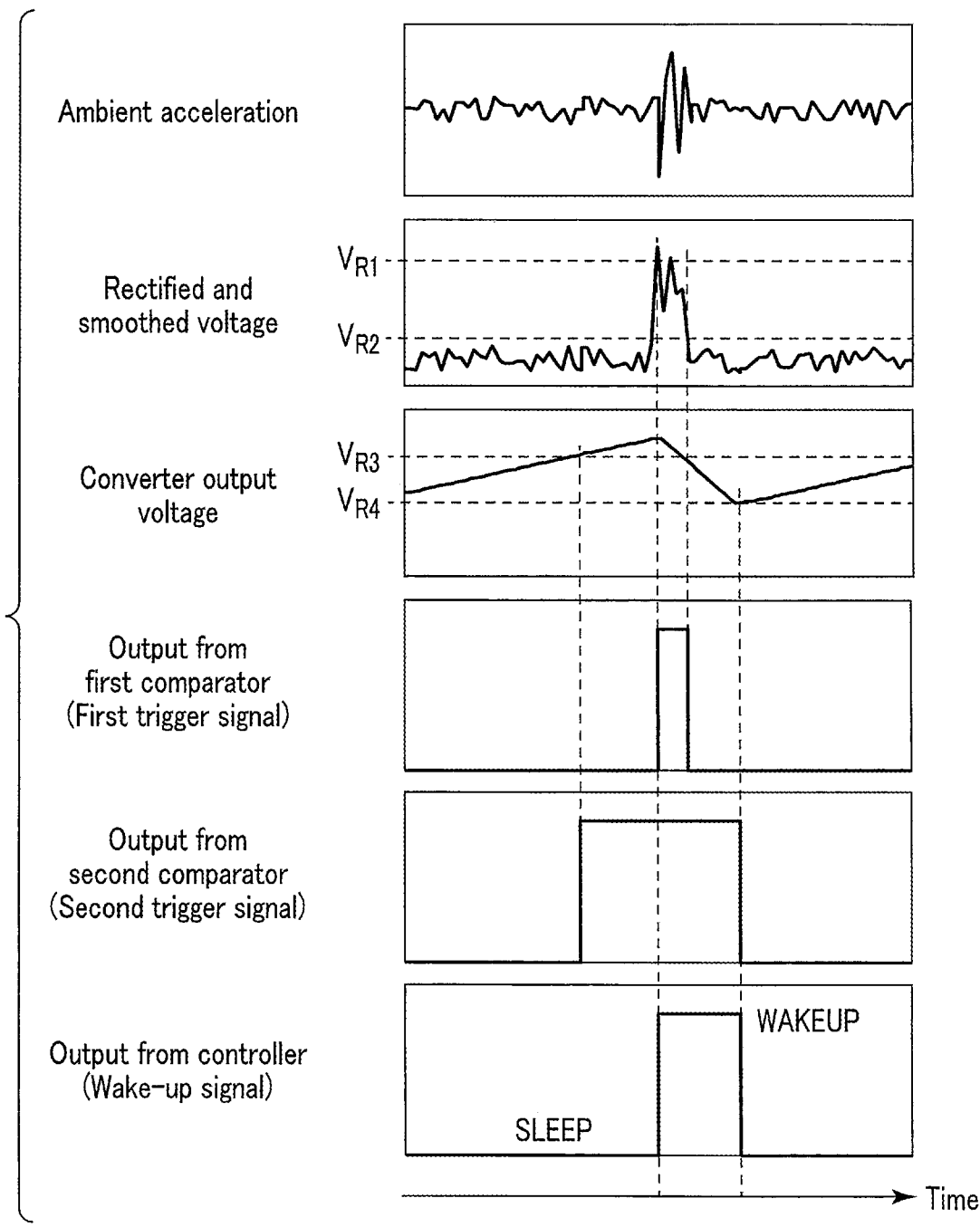
F I G. 2

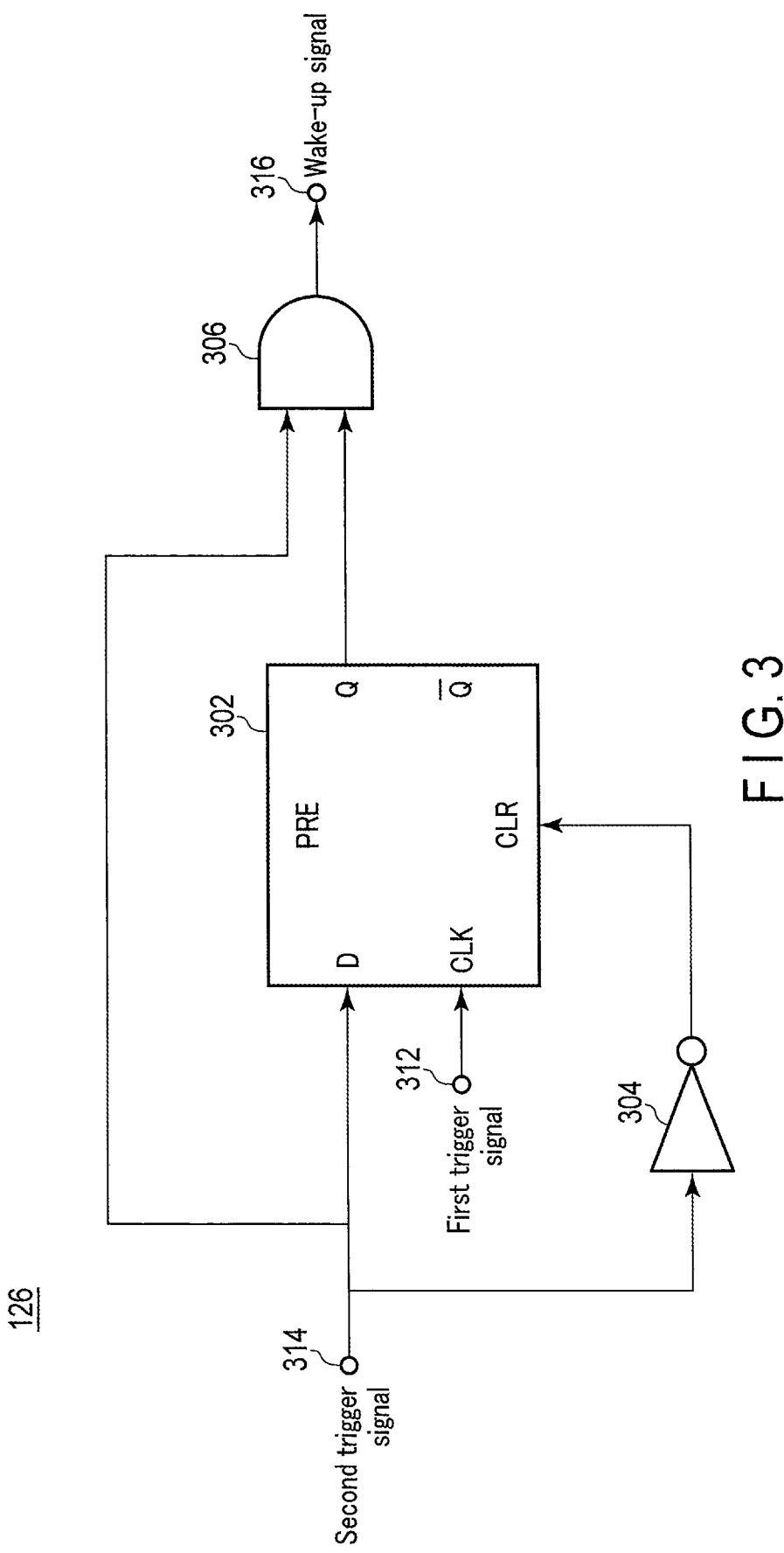
F I G. 3

CONTROL APPARATUS AND SENSOR APPARATUS

CROSS-REFERENCE TO RELATED APPLICATIONS

This application is based upon and claims the benefit of priority from Japanese Patent Application No. 2020-154731, filed Sep. 15, 2020, the entire contents of which are incorporated herein by reference.

FIELD

Embodiments described herein relate generally to a control apparatus and a sensor apparatus.

BACKGROUND

A vibration power generator generates power by using an ambient vibration such as a vibration of a car or a train and a vibration caused by rain hitting the ground. Such a vibration power generator is expected to replace power sources (e.g., a battery) that have been used for sensor apparatuses such as a condition monitoring apparatus.

In a system in which a vibration power generator and a condition monitoring apparatus are connected to each other, the average amount of power generated by the vibration power generator is required to be larger than that consumed by the condition monitoring apparatus in order to operate the condition monitoring apparatus in a stable manner. Thus, it is important to reduce the average amount of power consumed by the condition monitoring apparatus.

BRIEF DESCRIPTION OF THE DRAWINGS

FIG. 2 is a diagram illustrating how a control apparatus shown in FIG. 1 operates.

FIG. 3 is a diagram showing a configuration example of a controller shown in FIG. 1.

DETAILED DESCRIPTION

According to one embodiment, a control apparatus for controlling a sensor that operates on power supplied by a power generator via an electric circuit, the electric circuit including a rectifying and smoothing circuit configured to convert AC power output from the power generator into DC power and a converter configured to transform an output voltage of the rectifying and smoothing circuit, includes a first signal generator, a second signal generator and a controller. The first signal generator is configured to generate a first trigger signal based on the output voltage of the rectifying and smoothing circuit. The second signal generator is configured to generate a second trigger signal based on an output voltage of the converter. The controller is configured to switch an operation mode of the sensor between a sleep mode and an active mode based on the first trigger signal and the second trigger signal.

Hereinafter, embodiments will be described with reference to the accompanying drawings. Throughout the description of the embodiments below, the same elements will be denoted by the same reference symbols, and duplicate descriptions will be omitted. The drawings are schematically or conceptually illustrated.

Figure 1:
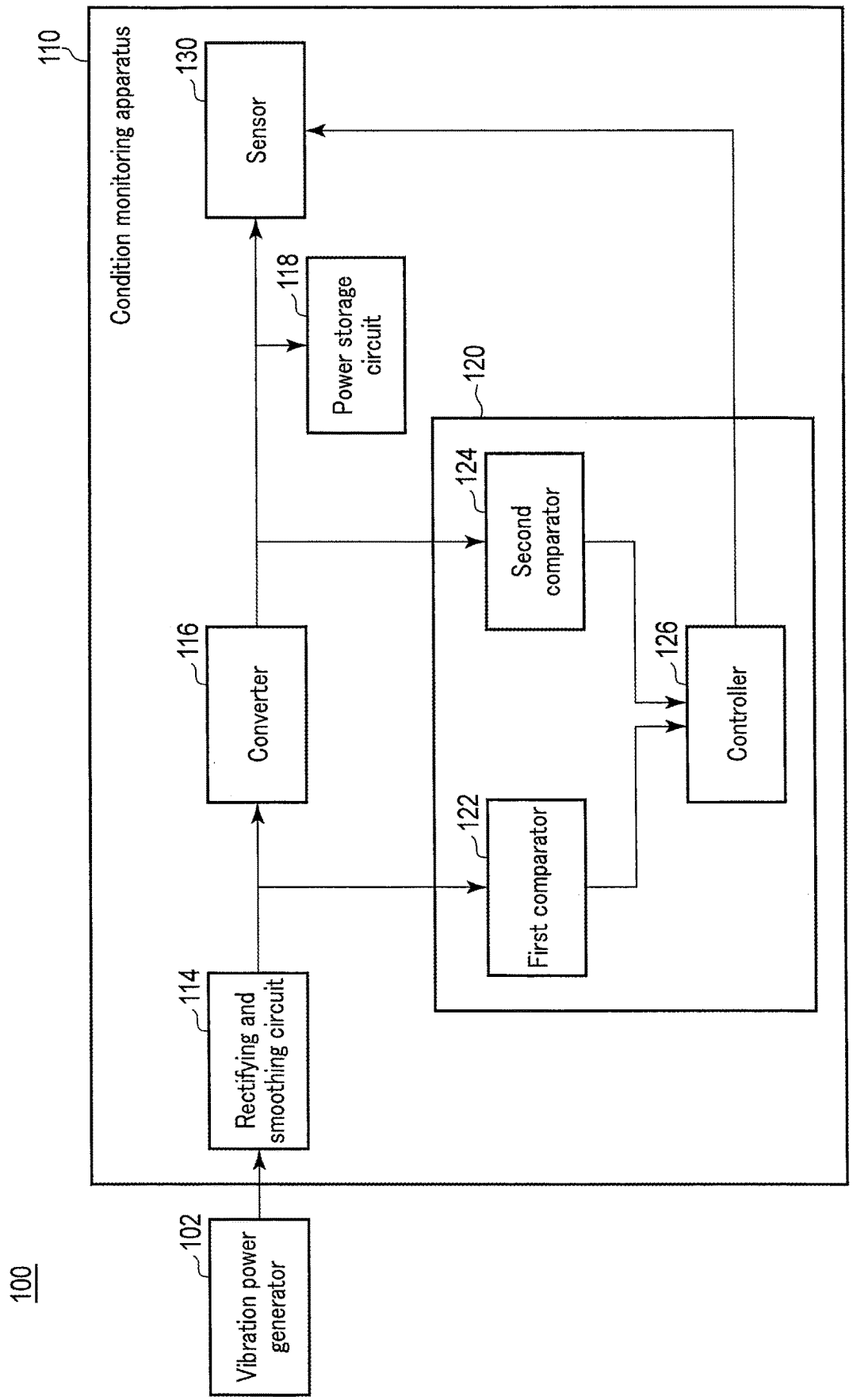
FIG. 1 is a diagram showing a condition monitoring system according to an embodiment.

FIG. 1 schematically shows a condition monitoring system 100 according to an embodiment. As shown in FIG. 1, the condition monitoring system 100 includes a vibration power generator 102 and a condition monitoring apparatus 110 corresponding to a sensor apparatus. The vibration power generator 102 is connected to the condition monitoring apparatus 110 and supplies power to the condition monitoring apparatus 110. The condition monitoring apparatus 110 operates on the power supplied by the vibration power generator 102.

The vibration power generator 102 converts ambient vibration energy into electric energy. Specifically, the vibration power generator 102 converts mechanical energy from a mechanical vibration, which is caused by an ambient vibration, into AC power. The AC power may be single-phase AC power. In one structural example, the vibration power generator 102 includes a moving unit and a stationary unit that movably supports the moving unit. The moving unit includes a coil, and the stationary unit includes a magnet arranged inside the coil. The relationship between the coil and the magnet may be reversed. That is, the moving unit may be provided with the magnet, and the stationary unit may be provided with the coil. When the vibration power generator 102 receives vibrations, the moving unit oscillates. This causes the magnet and the coil to move relative to each other, and a magnetic flux linked to the coil temporally varies. As a result, an electromotive force develops due to electromagnetic induction. In this manner, the vibrations applied to the vibration power generator 102 are converted to AC power. The vibration power generator 102 is one example of a power generator that generates AC power.

The condition monitoring apparatus 110 monitors a condition of an object. The condition monitoring apparatus 110 includes a rectifying and smoothing circuit 114, a converter 116, a power storage circuit 118, a control circuit 120, and a sensor 130.

The sensor 130 is used to monitor a condition of an object. In an example in which the condition monitoring apparatus 110 monitors a crack condition in a structure, the sensor 130 may be an acoustic emission (AE) sensor that detects an AE wave. The AE wave is a sound wave emitted from the inside of a solid-state material when the solid-state material is deformed or destroyed. By measuring such an AE wave by means of the sensor 130, the condition monitoring apparatus 110 detects an occurrence of a crack in the structure.

The rectifying and smoothing circuit 114 is connected to the vibration power generator 102 and converts the AC power output from the vibration power generator 102 into DC power. In one example, the rectifying and smoothing circuit 114 includes a rectifying circuit and a smoothing circuit. The rectifying circuit converts the AC power output from the vibration power generator 102 into DC power. In the case where the power generator is the vibration power generator 102, normally the DC power output from the rectifying circuit is a pulsating power. The rectifying circuit may include one or more diodes. For example, the rectifying circuit may be a full-wave rectifier that includes four bridge-connected diodes. The smoothing circuit smooths the DC power output from the rectifying circuit. The smoothing circuit includes, for example, one capacitor. The smoothing circuit may include a plurality of capacitors. The smoothing circuit may include a combination of a capacitor and an inductor. The smoothing circuit smooths a voltage in such a manner as to temporarily store a current as charges and emit the stored charges. That is, the smoothing circuit is a kind of power storage circuit that stores power.

The converter 116 is connected to the rectifying and smoothing circuit 114 and transforms a voltage output from the rectifying and smoothing circuit 114. The converter 116 is, for example, a DC-DC converter such as a buck-boost converter.

The power storage circuit 118 is connected to the converter 116 and temporarily stores a voltage output from the converter 116. The power storage circuit 118 may include one or more capacitors. The power storage circuit 118 may include a combination of a capacitor and a coil.

The converter 116 and the power storage circuit 118 are connected to the sensor 130, and a total voltage of the voltage output from the converter 116 and the voltage output from the power storage circuit 118 is applied to the sensor 130.

The sensor 130 operates on the power that is supplied by the vibration power generator 102 via an electric circuit that includes the rectifying and smoothing circuit 114, the converter 116, and the power storage circuit 118.

The control circuit 120 controls an operation mode of the sensor 130 based on the power output from the vibration power generator 102. The operation mode includes an active mode and a sleep mode. In the active mode, the sensor 130 performs a predetermined measurement. In the sleep mode, the sensor 130 stops operating. The control circuit 120 includes a first comparator 122, a second comparator 124, and a controller 126.

The first comparator 122 is connected to the rectifying and smoothing circuit 114. The first comparator 122 generates a first trigger signal based on the voltage output from the rectifying and smoothing circuit 114, and outputs the first trigger signal to the controller 126. The voltage output from the rectifying and smoothing circuit 114 is also referred to as a rectified and smoothed voltage. The first comparator 122 is also referred to as a first signal generator.

The first comparator 122 may have hysteresis characteristics. Specifically, the first comparator 122 may be configured such that it compares the rectified and smoothed voltage with a first reference voltage and a second reference voltage, then outputs a high-level signal to the controller 126 in response to the rectified and smoothed voltage becoming equal to or higher than the first reference voltage, and outputs a low-level signal to the controller 126 in response to the rectified and smoothed voltage becoming equal to or lower than the second reference voltage. The second reference voltage is lower than the first reference voltage.

Alternatively, the first comparator 122 may be configured such that it compares the rectified and smoothed voltage with a single reference voltage, then outputs the high-level signal to the controller 126 when the rectified and smoothed voltage is equal to or higher than the reference voltage, and outputs the low-level signal to the controller 126 when the rectified and smoothed voltage is lower than the reference voltage. To operate the sensor 130 in a stable manner, the first comparator 122 is desirably a comparator circuit having hysteresis characteristics.

The second comparator 124 is connected to the converter 116. The second comparator 124 generates a second trigger signal based on the voltage output from the converter 116, and outputs the second trigger signal to the controller 126. The voltage output from the converter 116 is also referred to as a converter output voltage. The second comparator 124 is also referred to as a second signal generator.

The second comparator 124 may have hysteresis characteristics. Specifically, the second comparator 124 may be configured such that it compares the converter output voltage with a third reference voltage and a fourth reference voltage, then outputs a high-level signal to the controller 126 in response to the converter output voltage becoming equal to or higher than the third reference voltage, and outputs a low-level signal to the controller 126 in response to the converter output voltage becoming equal to or lower than the fourth reference voltage. The fourth reference voltage is lower than the third reference voltage.

The third reference voltage is set to a value equal to or lower than the rated voltage of the sensor 130. The rated voltage of the sensor 130 means an upper limit of the voltage that can be applied to the sensor 130. Setting the third reference voltage to a value equal to or lower than the rated voltage prevents a voltage exceeding the rated voltage from being applied to the sensor 130. The fourth reference voltage is set to a value equal to or higher than the driving voltage of the sensor 130. The driving voltage of the sensor 130 means a lower limit of the voltage necessary to operate the sensor 130. Setting the fourth reference voltage to a value equal to or higher than the driving voltage prevents a voltage lower than the driving voltage from being applied to the sensor 130 in the active mode.

Alternatively, the second comparator 124 may be configured such that it compares the converter output voltage with a single reference voltage, then outputs the high-level signal to the controller 126 when the converter output voltage is equal to or higher than the reference voltage, and outputs the low-level signal to the controller 126 when the converter output voltage is lower than the reference voltage. To operate the sensor 130 in a stable manner, the second comparator 124 is desirably a comparator circuit having hysteresis characteristics.

The controller 126 is connected to the first comparator 122 and the second comparator 124. The controller 126 switches the operation mode of the sensor 130 between the active mode and the sleep mode based on the first trigger signal output from the first comparator 122 and the second trigger signal output from the second comparator 124.

The controller 126 generates a wake-up signal based on the first trigger signal and the second trigger signal and outputs the wake-up signal to the sensor 130. The wake-up signal is a control signal for controlling the operation mode of the sensor 130. For example, when the wake-up signal is at a low level, the sensor 130 is in the sleep mode, and when the wake-up signal is at a high level, the sensor 130 is in the active mode.

The controller 126 switches the wake-up signal to the high level when the first trigger signal is switched to the high level with the second trigger signal being at the high level. When the wake-up signal is switched to the high level, the sensor 130 transitions to the active mode and performs a predetermined measurement. The controller 126 switches the wake-up signal to the low level when at least one of the first trigger signal and the second trigger signal is switched to the low level. When the wake-up signal is switched to the low level, the sensor 130 transitions to the sleep mode.

Next, an operation example of the control circuit 120 will be described with reference to FIG. 2.

FIG. 2 illustrates how the ambient acceleration, the rectified and smoothed voltage, the converter output voltage, the first trigger signal, the second trigger signal, and the wake-up signal vary with time. Ambient acceleration means the acceleration of an ambient vibration applied to the vibration power generator 102.

As shown in FIG. 2, the first trigger signal, the second trigger signal, and the wake-up signal are all initially at the low level. The rectified and smoothed voltage varies with the ambient acceleration. The vibration power generator 102 generates power based on an ambient vibration. Thus, the power is gradually stored in the power storage circuit 118. In other words, the converter output voltage increases gradually. When the converter output voltage reaches the third reference voltage $V_{R3}$, the second trigger signal is switched to the high level. When the ambient vibration becomes larger and the rectified and smoothed voltage reaches the first reference voltage $V_{R1}$, the first trigger signal is switched to the high level. When the first trigger signal is switched to the high level with the second trigger signal being at the high level, the wake-up signal is switched to the high level. As a result, the sensor 130 wakes up and performs a predetermined measurement.

When the ambient vibration becomes smaller and the rectified and smoothed voltage drops to or below the second reference voltage $V_{R2}$, the first trigger signal is switched to the low level.

The stored power is consumed as the sensor 130 operates. For this reason, the converter output voltage gradually decreases. When the converter output voltage drops to or below the fourth reference voltage $V_{R4}$, the second trigger signal is switched to the low level, thereby causing the wake-up signal to be switched to the low level. As a result, the sensor 130 sleeps.

The wake-up signal may be switched to the low level when the first trigger signal is switched to the low level. In other words, the wake-up signal may be switched to the low level when the rectified and smoothed voltage drops to or below the second reference voltage $V_{R2}$.

Even when the rectified and smoothed voltage reaches the first reference voltage $V_{R1}$, the wake-up signal remains at the low level as long as the converter output voltage is equal to or lower than the third reference voltage $V_{R3}$. This makes it possible to keep the converter output voltage equal to or higher than the driving voltage of the sensor 130.

The above-described algorithm may be implemented either by software or by hardware. For example, the processing described in connection with the controller 126 may be performed by causing a processor (a circuit) such as a microprocessor to execute a software program. In the following, an example in which the controller 126 is implemented by an electric circuit that is hardware will be described with reference to FIGS. 3 and 4.

FIG. 3 shows an example of an electric circuit that implements the controller 126. In the example shown in FIG. 3, the controller 126 includes a delay (D-type) flip flop circuit 302, a NOT circuit 304, an AND circuit 306, input ports 312 and 314, and an output port 316.

Figure 4:
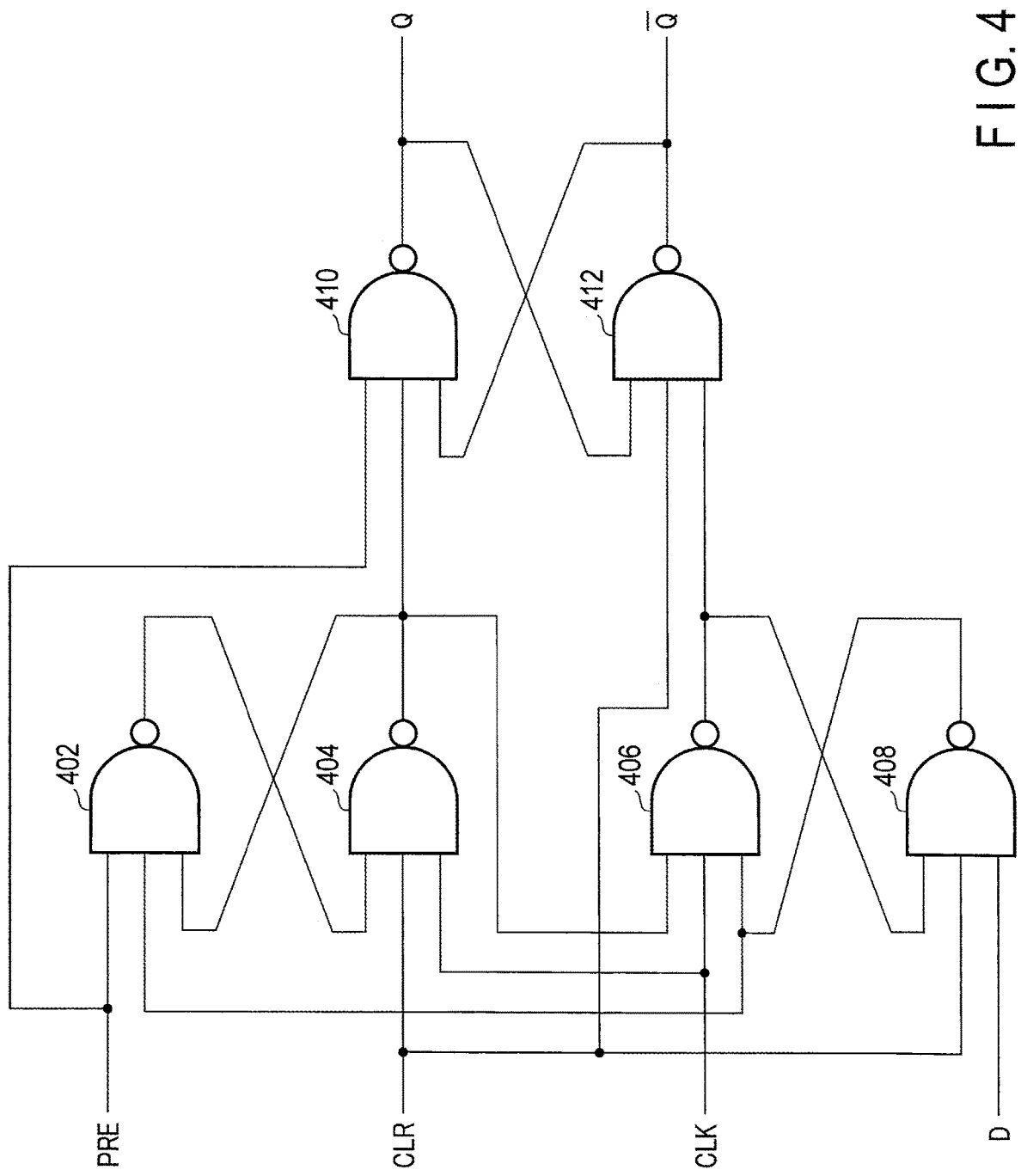
FIG. 4 is a diagram showing a configuration example of a delay (D-type) flip flop circuit shown in FIG. 3.

As the D-type flip flop circuit 302, a typical D-type flip flop circuit can be used. For example, a D-type flip flop circuit made by combining six three-input NAND gates 402, 404, 406, 408, 410 and 412 as shown in FIG. 4 can be used.

In FIG. 3, the input port 312, the input port 314, and the output port 316 are respectively connected to the first comparator 122, the second comparator 124, and the sensor 130 shown in FIG. 1. The input port 312 is connected to a clock (CLK) port of the D-type flip flop circuit 302. The input port 314 is connected to a delay (D) port of the D-type flip flop circuit 302, an input port of the NOT circuit 304, and a first input port of the AND circuit 306. An output port of the NOT circuit 304 is connected to a clear (CLR) port of the D-type flip flop circuit 302. A Q port of the D-type flip flop circuit 302 is connected to a second input port of the AND circuit 306. An output port of the AND circuit 306 is connected to the output port 316.

The first trigger signal is input to the CLK port of the D-type flip flop circuit 302. The second trigger signal is input to the D port of the D-type flip flop circuit 302, and a NOT operation output of the second trigger signal is input to the CLR port of the D-type flip flop circuit 302. The second trigger signal and a Q output of the D-type flip flop circuit 302 are input to the AND circuit 306. The AND circuit 306 generates an AND operation output of the second trigger signal and the Q output. This AND operation output is the wake-up signal.

The electric circuit shown in FIG. 3 is one configuration example of the controller 126, and the controller 126 may have other configurations. For example, the controller 126 may include a trigger signal detection circuit and a flip flop circuit.

As described above, the control circuit 120 controls the operation mode of the sensor 130 based on the power output from the vibration power generator 102. Specifically, the control circuit 120 is configured to generate the first trigger signal based on the voltage output from the rectifying and smoothing circuit 114, generate the second trigger signal based on the voltage output from the converter 116, and switch the operation mode of the sensor 130 between the sleep mode and the active mode based on the first trigger signal and the second trigger signal. Therefore, the condition monitoring apparatus 110 needs no other sensor (e.g., an acceleration sensor) to wake the sensor 130. As a result, power consumption in the condition monitoring apparatus 110 can be reduced.

For example, the condition monitoring apparatus 110 monitors a crack condition in an object by means of the sensor 130. When the object vibrates greatly, a large AE wave is emitted. In response to such a great vibration of the object, the control circuit 120 wakes the sensor 130. Specifically, when the object vibrates greatly, the rectified and smoothed voltage becomes high. This causes the first comparator 122 to output the high-level first trigger signal. In response to the high-level first trigger signal, the controller 126 wakes the sensor 130. In this manner, the sensor 130 can be made active when a large AE wave is emitted. The condition monitoring apparatus 110 can monitor a crack condition in an object without any other sensor such as an acceleration sensor.

In the embodiment described above, the vibration power generator 102 is provided independently of the condition monitoring apparatus 110. Alternatively, the condition monitoring apparatus 110 may include the vibration power generator 102.

At least one of the rectifying and smoothing circuit 114, the converter 116, the power storage circuit 118, and the control circuit 120 may be provided outside the condition monitoring apparatus 110. In one example, the control circuit 120 may be implemented as an independent control apparatus. Such a control apparatus may be installed in the condition monitoring apparatus 110 at the time of manufacturing the condition monitoring apparatus 110. In another example, the vibration power generator 102, the rectifying and smoothing circuit 114, the converter 116, the power storage circuit 118, and the control circuit 120 may be implemented as an independent power-supply apparatus. The condition monitoring apparatus 110 may be formed by connecting such a power-supply apparatus to the sensor 130. The condition monitoring apparatus 110 may incorporate the power-supply apparatus. The condition monitoring apparatus 110 may operate on a combination of the power supplied by the aforementioned power-supply apparatus and the power supplied by another power source.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A control apparatus for controlling a sensor that operates on power supplied by a power generator via an electric circuit, the electric circuit including a rectifying and smoothing circuit configured to convert AC power output from the power generator into DC power and a converter configured to transform an output voltage of the rectifying and smoothing circuit, the apparatus comprising:
   a first signal generator configured to generate a first trigger signal based on the output voltage of the rectifying and smoothing circuit;
   a second signal generator configured to generate a second trigger signal based on an output voltage of the converter; and
   a controller configured to switch an operation mode of the sensor between a sleep mode and an active mode based on the first trigger signal and the second trigger signal.

2. The apparatus according to claim 1, wherein
the first signal generator is configured to:
   output the first trigger signal of a first signal level in response to the output voltage of the rectifying and smoothing circuit becoming equal to or higher than a first reference voltage; and
   output the first trigger signal of a second signal level in response to the output voltage of the rectifying and smoothing circuit becoming equal to or lower than a second reference voltage, the second signal level being different from the first signal level, the second reference voltage being lower than the first reference voltage.

3. The apparatus according to claim 1, wherein
the second signal generator is configured to:
   output the second trigger signal of a third signal level in response to the output voltage of the converter becoming equal to or higher than a third reference voltage; and
   output the second trigger signal of a fourth signal level in response to the output voltage of the converter becoming equal to or lower than a fourth reference voltage, the third signal level being different from the third signal level, the fourth reference voltage being lower than the third reference voltage.

4. The apparatus according to claim 1, wherein
the first signal generator is configured to:
   output the first trigger signal of a first signal level in response to the output voltage of the rectifying and smoothing circuit becoming equal to or higher than a first reference voltage; and
   output the first trigger signal of a second signal level in response to the output voltage of the rectifying and smoothing circuit becoming equal to or lower than a second reference voltage, the second signal level being different from the first signal level, the second reference voltage being lower than the first reference voltage,
the second signal generator is configured to:
   output the second trigger signal of a third signal level in response to the output voltage of the converter becoming equal to or higher than a third reference voltage; and
   output the second trigger signal of a fourth signal level in response to the output voltage of the converter becoming equal to or lower than a fourth reference voltage, the third signal level being different from the third signal level, the fourth reference voltage being lower than the third reference voltage, and
the controller is configure to:
   switch the sensor from the sleep mode to the active mode when the first trigger signal is switched to the first signal level while the second trigger signal is at the third signal level; and
   switch the sensor from the active mode to the sleep mode when the first trigger signal is switched to the second signal level or when the second trigger signal is switched to the fourth signal level.

5. The apparatus according to claim 4, wherein the controller is configured to switch the sensor from the active mode to the sleep mode when the second trigger signal is switched to the fourth signal level while the first trigger signal is at the second signal level.

6. The apparatus according to claim 1, wherein the controller includes a flip flop circuit.

7. The apparatus according to claim 6, wherein the flip flop circuit is a delay flip flop circuit that includes six NAND gates.

8. A sensor apparatus comprising:
   the control apparatus according to claim 1;
   the sensor; and
   the electric circuit.

9. The apparatus according to claim 8, further comprising the power generator.

10. The apparatus according to claim 8, wherein the sensor is an acoustic emission (AE) sensor configured to measure an AE wave.

* * * * *